(12) United States Patent
Bright

(10) Patent No.: US 9,012,044 B2
(45) Date of Patent: Apr. 21, 2015

(54) PROCESS FOR FORMING OPTICALLY CLEAR CONDUCTIVE METAL OR METAL ALLOY THIN FILMS AND FILMS MADE THEREFROM

(75) Inventor: Clark I. Bright, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 574 days.

(21) Appl. No.: 13/388,329

(22) PCT Filed: Jul. 26, 2010

(86) PCT No.: PCT/US2010/043180
§ 371 (c)(1),
(2), (4) Date: Feb. 1, 2012

(87) PCT Pub. No.: WO2011/017037
PCT Pub. Date: Feb. 10, 2011

(65) Prior Publication Data

US 2012/0125660 A1 May 24, 2012

Related U.S. Application Data

(60) Provisional application No. 61/230,829, filed on Aug. 3, 2009.

(51) Int. Cl.
*B32B 15/04* (2006.01)
*B32B 17/06* (2006.01)
(Continued)

(52) U.S. Cl.
CPC .......... *H05K 9/0094* (2013.01); *C22C 5/06* (2013.01); *C23C 14/024* (2013.01); *C23C 14/086* (2013.01); *C23C 14/20* (2013.01); *C23C 14/562* (2013.01)

(58) Field of Classification Search
CPC .......... B32B 9/00; B32B 15/00; B32B 15/04; B32B 17/00; B32B 17/06; B32B 2255/06; B32B 2255/205; B32B 2255/28; B32B 2255/00; C03C 15/00; C03C 17/00; C03C 17/06; C03C 17/23; C03C 17/3411; C03C 17/34; C03C 17/36; C03C 17/3602; C03C 17/3604; C03C 17/3607; C03C 17/361; C03C 17/3613; C03C 17/3615; C03C 17/3639; C03C 17/3642; C03C 17/3657; C03C 17/366; C03C 17/3681; C03C 17/32; C03C 17/3405; C03C 17/42; C03C 17/38
USPC ......... 428/426, 428, 432, 688, 689, 699, 701, 428/702, 434; 427/402, 419.1, 419, 419.3, 427/207.1
See application file for complete search history.

(56) References Cited

U.S. PATENT DOCUMENTS 3,529,074 A 9/1970 Lewis
4,645,714 A 2/1987 Roche et al.
(Continued)

FOREIGN PATENT DOCUMENTS

EP 1860930 11/2007
JP 2007-299672 11/2007
(Continued)

OTHER PUBLICATIONS

Affinito et al., "Vacuum Deposited Polymer/Metal Multilayer Films for Optical Application," *Thin Solid Films*, 270, (1995) pp. 43-48.

*Primary Examiner* — David Sample
*Assistant Examiner* — Lauern Colgan
(74) *Attorney, Agent, or Firm* — James A. Baker; Stephen F. Wolf; Yen Tong Florczak

(57) ABSTRACT

A process of forming optically clear conductive metal or metal alloy thin films is provided that includes depositing the metal or metal alloy film on a polycrystalline seed layer that has been deposited directly on a nucleation layer of metal oxide comprising zinc oxide. Also conductive films made by this process are provided. In some embodiments, the metal alloy thin films include silver/gold alloys.

18 Claims, 5 Drawing Sheets

(51) Int. Cl.
*B05D 1/00* (2006.01)
*H05K 9/00* (2006.01)
*C22C 5/06* (2006.01)
*C23C 14/02* (2006.01)
*C23C 14/08* (2006.01)
*C23C 14/20* (2006.01)
*C23C 14/56* (2006.01)

(56) References Cited

U.S. PATENT DOCUMENTS

| | | |
|---|---|---|
| 4,696,719 A | 9/1987 | Bischoff |
| 4,722,515 A | 2/1988 | Ham |
| 4,782,216 A | 11/1988 | Woodard |
| 4,786,783 A | 11/1988 | Woodard |
| 4,842,893 A | 6/1989 | Yializis et al. |
| 4,954,371 A | 9/1990 | Yializis |
| 5,018,048 A | 5/1991 | Shaw et al. |
| 5,032,461 A | 7/1991 | Shaw et al. |
| 5,062,939 A | 11/1991 | Roland et al. |
| 5,097,800 A | 3/1992 | Shaw et al. |
| 5,125,138 A | 6/1992 | Shaw et al. |
| 5,306,547 A | 4/1994 | Hood et al. |
| 5,324,374 A | 6/1994 | Harmand et al. |
| 5,332,888 A | 7/1994 | Tausch et al. |
| 5,440,446 A | 8/1995 | Shaw et al. |
| 5,521,765 A * | 5/1996 | Wolfe .................... 359/885 |
| 5,547,908 A | 8/1996 | Furuzawa et al. |
| 5,773,102 A | 6/1998 | Rehfeld |
| 6,040,056 A | 3/2000 | Anzaki et al. |
| 6,045,864 A | 4/2000 | Lyons et al. |
| 6,132,882 A | 10/2000 | Landin et al. |
| 6,214,422 B1 | 4/2001 | Yializis |
| 6,231,939 B1 | 5/2001 | Shaw et al. |
| 6,352,761 B1 | 3/2002 | Hebrink et al. |
| 6,368,699 B1 | 4/2002 | Gilbert et al. |
| 6,541,133 B1 | 4/2003 | Schicht et al. |
| 6,576,349 B2 | 6/2003 | Lingle et al. |
| 6,679,971 B2 | 1/2004 | Tone et al. |
| 6,797,396 B1 | 9/2004 | Liu et al. |
| 6,811,867 B1 | 11/2004 | McGurran et al. |
| 6,830,713 B2 | 12/2004 | Hebrink et al. |
| 6,929,864 B2 | 8/2005 | Fleming et al. |
| 6,965,191 B2 | 11/2005 | Koike et al. |
| 7,186,465 B2 | 3/2007 | Bright |
| 7,215,473 B2 | 5/2007 | Fleming |
| 7,238,401 B1 | 7/2007 | Dietz |
| 7,241,506 B2 | 7/2007 | Hartig |
| 7,351,479 B2 | 4/2008 | Funkenbusch et al. |
| 7,393,557 B2 | 7/2008 | Fleming et al. |
| 2003/0148115 A1 * | 8/2003 | Glenn et al. .................. 428/432 |
| 2004/0033384 A1 * | 2/2004 | Funkenbusch et al. ....... 428/626 |
| 2005/0008852 A1 * | 1/2005 | Hartig ........................... 428/336 |
| 2005/0181123 A1 * | 8/2005 | Fleming et al. ............... 427/162 |
| 2005/0247470 A1 * | 11/2005 | Fleming et al. ........... 174/35 MS |
| 2006/0035073 A1 * | 2/2006 | Funkenbusch et al. ....... 428/336 |
| 2006/0043895 A1 | 3/2006 | Choi |
| 2006/0275613 A1 * | 12/2006 | Butz et al. ..................... 428/432 |
| 2007/0207327 A1 * | 9/2007 | Glenn et al. .................. 428/450 |
| 2007/0237980 A1 * | 10/2007 | Hartig et al. ................. 428/623 |
| 2008/0163929 A1 * | 7/2008 | Krasnov ....................... 136/265 |
| 2009/0109537 A1 * | 4/2009 | Bright et al. .................. 359/588 |
| 2009/0246552 A1 * | 10/2009 | Stoessel et al. ............... 428/639 |
| 2009/0303602 A1 * | 12/2009 | Bright et al. .................. 359/585 |
| 2010/0089621 A1 * | 4/2010 | Stoss et al. .................... 174/254 |
| 2010/0316852 A1 * | 12/2010 | Condo et al. .................. 428/201 |
| 2012/0125660 A1 * | 5/2012 | Bright ........................ 174/126.4 |
| 2012/0127578 A1 * | 5/2012 | Bright et al. .................. 359/585 |
| 2012/0321867 A1 * | 12/2012 | Glenn et al. .................. 428/216 |

FOREIGN PATENT DOCUMENTS

| | | |
|---|---|---|
| WO | WO 2008/083308 A1 | 7/2008 |
| WO | WO-2008083308 * | 7/2008 |
| WO | WO 2008/112451 A2 | 9/2008 |
| WO | WO 2011/017039 A2 | 2/2011 |

* cited by examiner

PROCESS FOR FORMING OPTICALLY CLEAR CONDUCTIVE METAL OR METAL ALLOY THIN FILMS AND FILMS MADE THEREFROM

CROSS REFERENCE TO RELATED APPLICATIONS

This application is a national stage filing under 35 U.S.C. 371 of PCT/US2010/043180, filed 26 Jul. 2010, which claims priority to U.S. Provisional Application No. 61/230,829, filed 3 Aug. 2009, the disclosure of which is incorporated by reference in its/their entirety herein.

FIELD

Electrically conductive metal or metal alloy films are provided that have high visible light transmittance and low electrical resistance. These films are suitable, for example, in electromagnetic interference (EMI) shielding and automotive applications.

BACKGROUND

Optical films can be utilized in a variety of applications. These films sometimes can employ a thin metal layer e.g., silver. Optical films can be used in various constructions on supports such as glass or flexible substrates for a variety of purposes such as in solar control films, EMI shielding films, window films, and conductor films. These films can have high visible light transmission, and if metalized, low electrical resistivity.

There is a proportional relationship between optical transmission and resistivity in metal, e.g., silver. This relationship makes the typical objective, forming a film having both high visible light transmission and low resistivity, a delicate balance because changing the performance of either property can adversely affect the other. When forming a metal layer, the metal can agglomerate as it is deposited. This can result in a film that is not homogeneous, and can require application of a relatively thick layer of metal to provide an effective shielding film. This agglomeration or formation of islands makes the optical transmission diminish and causes an increase in resistivity.

SUMMARY

There is a need for optical films prepared on transparent supports that have high optical transmission, low electrical resistivity, and resistance to corrosion or deterioration due to environmental factors such as high temperature, high humidity, or oxidation by exposure to the atmosphere. Also there is a need for a method of preparing such films. Furthermore, as handheld electronic devices become smaller and smaller there is a need for conductive optical films that can have high visible transmission, low resistivity, and are made with much less material.

In one aspect, a method for forming an optically clear conductive film on a support is provided that includes providing a layer of metal oxide adjacent to a transparent support; forming a polycrystalline seed layer comprising zinc oxide directly upon the metal oxide layer; and depositing a conductive metal or metal alloy layer directly upon the polycrystalline seed layer, and depositing a barrier layer directly upon the metal or metal alloy layer.

In a second aspect, an optically clear conductive film is provided that includes a transparent support; a layer of a metal oxide disposed upon the support; a polycrystalline seed layer comprising zinc oxide upon the metal oxide layer; a conductive metal or metal alloy layer disposed upon the polycrystalline seed layer; and a barrier layer disposed directly upon the metal or metal alloy layer.

In a third aspect, a method for making a glazing article is provided that includes assembling a layer of glazing material and an optically clear film, wherein the film comprises a transparent support, a layer of metal oxide disposed upon the first polymeric material, a polycrystalline seed layer comprising zinc oxide upon the metal oxide layer, a conductive metal or metal alloy layer disposed upon the polycrystalline seed layer, and a barrier layer disposed upon the conductive metal or metal alloy layer, and bonding the glazing material and the film together into a unitary article. The glazing material and film can be bonded together into a unitary article. The article can have high visible light transmittance, low electrical resistivity, and corrosion resistance.

As used herein:

the term "polymer" refers homopolymers and copolymers, as well as homopolymers or copolymers that may be formed in a miscible blend, e.g., by coextrusion or by reaction, including, e.g., transesterification. The term "copolymer" includes both random and block copolymers;

the term "barrier layer" refers to the layer or multiple layers directly in contact with the electrically-conducting metal or metal alloy layer and upon which the metal or metal oxide layer is deposited and is a layer or multiple layers that resists moisture and oxygen transmission;

the term "crosslinked polymer" refers to a polymer in which the polymer chains are joined together by covalent chemical bonds, usually via crosslinking molecules or groups, to form a network polymer. A crosslinked polymer is generally characterized by insolubility, but may be swellable in the presence of an appropriate solvent;

the term "light" refers to solar radiation. The term "visible light transmittance" or "visible light-transmissive" when used with respect to a support, layer, film or article, refers to a support, layer, film or article having at least about 70% visible light transmittance at 550 nm;

the term "infrared-reflective" when used with respect to a support, layer, film or article, refers to a support, layer, film or article that reflects at least about 50% of light in a band at least 100 nm wide in a wavelength region from about 700 nm to about 2000 nm, measured at a near-normal angle (e.g., at about a 6° angle of incidence); the term "non-planar" surface or article (e.g., of glass or other glazing material), refers to a surface or article having a continuous, intermittent, unidirectional or compound curvature;

the term "compound curvature" refers to a surface or article having curves in two different, non-linear directions from a single point; the term "metal" includes a pure metal or a metal alloy. The term "extensible" when used with respect to a metal layer refers to a layer that when incorporated into a visible light-transmissive film can be stretched by at least about 3% in an in-plane direction without loss of electrical continuity and without forming visible discontinuities in the surface of the metal or metal alloy layer as detected by the naked eye at a distance of about 0.25 meters;

the term "without substantial cracking or creasing" refers to a film that has been laminated into an article, and in which there are no visible discontinuities in the surface of the film or the metal or metal alloy layers as detected by the naked eye at a distance of about 1 meter, preferably about 0.5 meters;

the term "without substantial wrinkling" refers to a film that has been laminated into an article, and in which there are no small ridges or furrows resulting from contraction of the smooth film surface as detected using the naked eye at a distance of about 1 meter, preferably about 0.5 meters; the term "polycrystalline" refers to materials that are composed of many crystallites of varying size and orientation;

the term "optically clear" refers to a laminated article in which there is no visibly noticeable distortion, haze or flaws as detected by the naked eye at a distance of about 1 meter, preferably about 0.5 meters;

the term "substantially continuous" refers to thin metal or metal alloy films that have been deposited that have electrical sheet resistivity of less than about 300 ohms/square; and the term "optical thickness" when used with respect to a layer refers to the physical thickness of the layer times its in-plane index of refraction. A preferred optical thickness is about ¼ the wavelength of the center of the desired pass band for transmitted light.

The provided films and articles can have increased resistance to delamination, fracture or corrosion when formed or when subjected to bending, flexing, stretching, deforming operations or corrosive conditions, yet still maintain adequate electrical conductivity and good EMI shielding performance. In one embodiment, the metal or metal alloy layers are substantially continuous over substantial areas of the film, e.g., over portions of the film where EMI shielding, heating, or like functionality is desired. In other embodiments, the metal or metal alloy layers can be completely continuous over the entire film; in other embodiments the metal or metal alloy layers can be patterned to define a limited number of apertures, holes, or channels for desired functionality (e.g., to provide one or more frequency selective surfaces or distinct, electrically conductive pathways).

The above summary is not intended to describe each disclosed embodiment of every implementation of the present invention. The brief description of the drawing and the detailed description which follows more particularly exemplify illustrative embodiments. In the drawings, the layers are not drawn to scale.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

A method is provided for forming an optically clear thin conductive film on a support. The method includes providing a layer of metal oxide adjacent to a transparent support, forming a polycrystalline seed layer that comprises zinc oxide directly upon the metal oxide layer, depositing a first conductive metal or metal alloy layer directly upon the polycrystalline seed layer, and depositing a barrier layer directly upon the conductive metal or metal oxide layer. Conventionally, thin film conductive layers have been deposited on transparent supports. Seed layers comprising zinc oxide have been used on flexible polymeric supports to apply an extensible silver or silver alloy layer over the support resulting in films with high visible light transmittance and low electrical resistance as disclosed, for example, in PCT Pat. Publ. No. WO 2008/083308 (Stoss et al.).

Figure 1A:
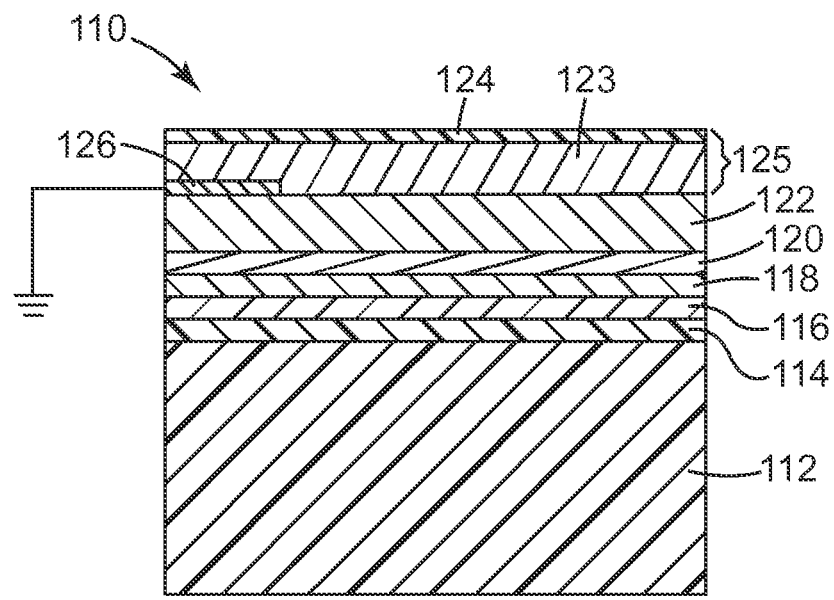
FIGS. 1A and 1B are schematic drawings of two embodiments of the provided conductive films.
Figure 1B:
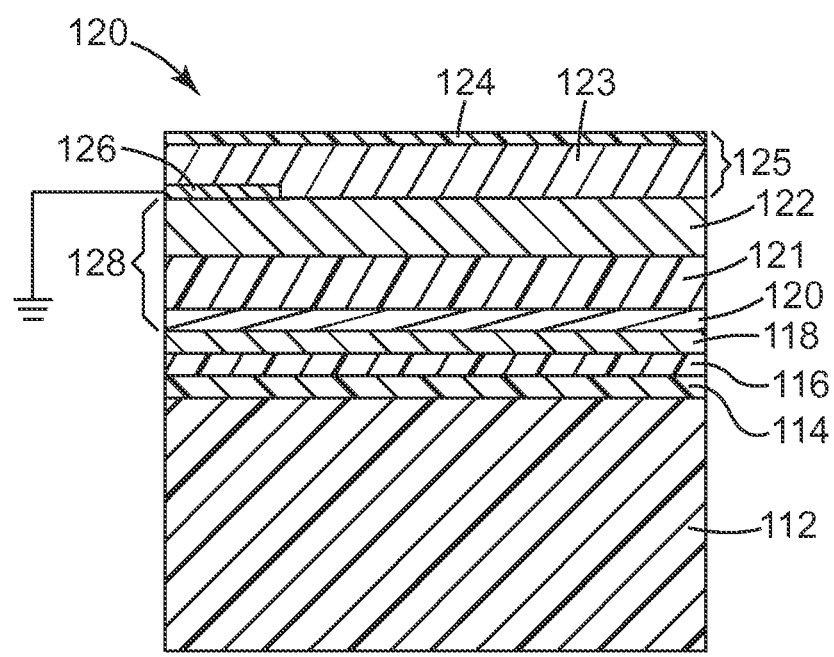

Referring to FIG. 1A, an exemplary film 110, e.g., for use as an EMI shield, is shown. Film 110 includes support 112 made of a visible light-transmissive material such as glass or polyethylene terephthalate ("PET"), surface-enhancing layer 114, which is formed by exposing the PET to a plasma, crosslinked polymer layer 116 made up of a vapor-deposited acrylate polymer, metal oxide layer 118 which can be tin oxide, and a seed layer which can be doped zinc oxide 120 atop support 112. Visible light-transmissive metal layer 122 made of silver alloy lies atop seed layer 120. Barrier layer 125 lies atop metal layer 122 and includes, in this embodiment, metal oxide capping layer 123 and protective polymer layer 124. Metal layer 122 can be grounded if desired via optional electrode 126. In FIG. 1B, another exemplary film 120. Film 120 resembles film 110, but includes Fabry-Perot stack 128 that includes seed layer 120, a polymer layer 121 made of a crosslinked polyacrylate which, in some embodiments can be the same material that is used as protective layer 123, and transmissive metal layer 122.

A variety of visible light-transmissive supports can be employed. In one embodiment, the supports can have a visible light transmission of at least about 80% at 550 nm. Exemplary supports include but are not limited to glass and flexible plastic materials including thermoplastic films such as polyesters (e.g., polyethylene terephthalate (PET) or polyethylene naphthalates), polyacrylates (e.g., polymethyl methacrylate), polycarbonates, polypropylenes, high or low density polyethylenes, polysulfones, polyether sulfones, polyurethanes, polyamides, polyvinyl butyral (PVB), polyvinyl chloride, polyvinylidene difluoride and polyethylene sulfide; and thermoset films such as cellulose derivatives, polyimide, polyimide benzoxazole and polybenzoxazole. The support can also be a multilayer optical film ("MOF"), such as those described in U.S. Pat. No. 7,215,473 (Fleming).

In one embodiment, the provided films can be prepared on a support including PET. The support can have a thickness of about 0.01 to about 1 mm. The support can, however, be considerably thicker, for example, when a self-supporting article is desired. Such films or articles can conveniently also be made by forming a seed layer and a metal or metal alloy layer atop a flexible support and laminating or otherwise joining the flexible support to a thicker, inflexible or less flexible supplemental support as described in more detail below. It has been found, surprisingly, that when the metal or metal alloy layer is deposited on a seed layer of zinc oxide which has, in turn, been deposited on a layer of metal oxide, that films with enhanced optical and electrical properties are produced. The metal oxide layer can include one or more of ZnO, $ZnSnO_3$, $Zn_2SnO_4$, $In_2O_3$, bismuth oxide, and indium-tin-oxide.

When the metallic conducting layer includes silver or silver alloy, zinc oxide (ZnO) can be an effective metal oxide layer—even when it is non-continuous. It is also contemplated that the metal oxide layer can be thicker, even significantly thicker than the seed layer as long as it preserves transparency of the optical filter. However, coating a thicker zinc oxide layer can add to the manufacturing cost and reduce the yield of highly transmissive material. The combination use of a metal oxide layer and a seed layer can be as effective a barrier to environmental deterioration as a relatively thicker single layer of zinc oxide. Hence, the combination of tin oxide (metal oxide layer) and zinc oxide (seed layer) sputtered at a line speed of 1500 cm/min helps to provide similar corrosion protection as compared to a single coating of zinc oxide sputtered at a line speed of 300 cm/min.

The smoothness and continuity of the conductive metal or metal alloy film and the adhesion of subsequently applied layers to the support can be enhanced by appropriate pretreatment of the support. In one embodiment, the pretreatment regimen involves an electrical discharge pretreatment of the support in the presence of a reactive or non-reactive atmosphere (e.g., plasma, glow discharge, corona discharge, dielectric barrier discharge or atmospheric pressure discharge); chemical pretreatment; or flame pretreatment. These pretreatments can help ensure that the surface of the support will be receptive to the subsequently applied layers. A specific embodiment, involves plasma pretreatment. Another specific pretreatment regimen involves coating the support with an inorganic or organic base coat layer, optionally followed by further pretreatment using plasma or one of the other pretreatments described above. In another embodiment, organic base coat layers, and especially base coat layers based on crosslinked acrylate polymers are employed. The base coat layer can be formed by flash evaporation and vapor deposition of a radiation-crosslinkable monomer (e.g., an acrylate monomer), followed by crosslinking in situ (using, for example, an electron beam apparatus, UV light source, electrical discharge apparatus or other suitable device), as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.), U.S. Pat. No. 6,214,422 (Yializis); U.S. Pat. No. 7,186,465 (Bright); and in J. Affinito, P. Martin, M. Gross, C. Coronado and E. Greenwell, "Vacuum deposited polymer/metal multilayer films for optical application", *Thin Solid Films*, 270, 43-48 (1995). If desired, the base coat can also be applied using conventional coating methods such as roll coating (e.g., gravure roll coating) or spray coating (e.g., electrostatic spray coating), then crosslinked using, for example, UV radiation. The desired chemical composition and thickness of the base coat layer will depend in part on the nature of the support. For example, for a PET support, the base coat layer is formed from an acrylate monomer and typically will have a thickness of only a few nanometers up to about 2 micrometers.

The seed layer can be made from zinc oxide. In some embodiments the seed layer can be doped with a dopant. For example, zinc oxide can be doped with aluminum oxide. The dopant can be present in 5 weight percent (wt %) or less, 2 wt % or less, or even 1 wt % or less. The seed layer can be formed on the metal oxide layer prior to depositing the metal or metal alloy layer. The seed layer can be formed by deposition of zinc on the support in an oxidizing atmosphere, using techniques employed in the film metalizing art such as sputtering (e.g., cathode or planar magnetron sputtering), evaporation (e.g., resistive or electron beam evaporation), chemical vapor deposition, plating and the like. In one embodiment, the seed layer or layers are sufficiently thick so as to provide a surface that can facilitate the formation of a homogeneous metal layer having a minimum of agglomeration and sufficiently thin so as to ensure that the resultant film and articles employing the film will have the desired degree of visible light transmission. In one embodiment, the physical thickness of the seed layer can be from about 1 nm to about 5 nm. In a second embodiment, the thickness of the seed layer is from about 1 nm to about 4 nm. In a third embodiment, the thickness of the seed layer is from about 2 nm to about 3 nm.

The adhesion of the metal oxide layer to the support can be improved by placing the metal oxide layer atop a crosslinked polymeric base layer. The adhesion can also be improved by including an adhesion-promoting or anticorrosion additive in the crosslinked polymeric base layer. Suitable adhesion-promoting or anticorrosion additives include mercaptans, acids (such as carboxylic acids or organic phosphoric acids), triazoles, dyes and wetting agents. A specific adhesion-promoting additive, ethylene glycol bis-thioglycolate, is described in U.S. Pat. No. 4,645,714 (Roche et al.). The additive is present in amounts sufficient to obtain the desired degree of increased adhesion, without causing undue oxidation or other degradation of the metal oxide layer.

The electrically-conductive metal or metal oxide layer can be made from a variety of materials. In one embodiment, suitable metals include elemental silver, gold, copper, nickel, and chrome. Alloys can also be employed. In a specific embodiment, a 85/15 (wt %/wt %) silver-gold alloy can be used for the metallic electrically-conducting layer. Alloys of silver that include silver-gold, silver-palladium, silver-gold-palladium, or dispersions containing these metals in admixture with one another or with other metals are also contemplated. When additional metal layers are employed, they can be the same as or different from one another, and need not have the same thickness. The metal layer or layers are sufficiently thick so as to be continuous, and sufficiently thin so as to ensure that the film and articles employing the film will have the desired degree of visible light transmission. In one embodiment, the physical thickness (as opposed to the optical thickness) of the metal layer or layers is about 5 to about 20 nm. In another embodiment, the thickness of the metal layer is from about 7 to about 15 nm. In a third embodiment, the thickness of the metal layer is from about 10 nm to about 12 nm. The metal layers can be formed by deposition on the above-mentioned support using techniques employed in the film metalizing art such as sputtering (e.g., cathode or planar magnetron sputtering), evaporation (e.g., resistive or electron beam evaporation), chemical vapor deposition, plating and the like.

The provided films and articles including the provided films can have a transmission of at least about 65%, measured along the normal axis. Typically, the transmission is measured at a wavelength of 550 nm. In another embodiments, the films can have at least about 70% visible light transmittance.

In still another embodiments, the films can have at least about 80% visible light transmittance.

The provided films and articles including the provided films can have low electrical resistance. The films can have less than about 300 ohms per square sheet resistance, less than about 200 ohms/square sheet resistance, less than about 100 ohms/square sheet resistance, or even less than about 50 ohms/square sheet resistance. For example, the films can have from about 5 to about 100 ohms per square sheet resistance, or from about 20 to about 75 ohms per square resistance, or from about 30 to about 50 ohms per square sheet resistance In addition to their optical function, the provided films can be used for purposes such as antennae, electromagnetic interference (EMI) shielding, and for electrically heated film applications such as de-fogging, de-misting, defrosting or deicing of glazing and displays. Electrically heated film applications can require substantial current-carrying ability, but must employ a very thin (and accordingly very fragile) metal or metal alloy layer when visible light transparency is required. Electrically heated film applications are disclosed in U.S. Pat. No. 3,529,074 (Lewis), U.S. Pat. No. 4,782,216 and U.S. Pat. No. 4,786,783 (both to Woodard), U.S. Pat. No. 5,324,374 (Harmand et al.) and U.S. Pat. No. 5,332,888 (Tausch et al.). Electrically heated films are of particular interest in vehicular safety glazing. Conventional vehicular safety glazing is a laminate of two rigid layers, typically glass, and an anti-lacerative mechanical energy-absorbing interlayer, typically plasticized polyvinyl butyral ("PVB"). Electrically heated glazing is prepared by placing the PVB layer, an electrically heated film layer and suitable electrodes between the glass layers, eliminating air from the engaging surfaces, and then subjecting the assembly to elevated temperature and pressure in an autoclave to fusion bond the PVB, electrically heated film layer and glass into an optically clear structure. The resulting electrically heated safety glazing can be used, for example, in the windshield, backlight, and sunroof or side windows of an automobile, airplane, train or other vehicle.

Optionally, additional crosslinked polymeric spacing layers and additional electrically-conducting metallic layers can be applied atop the first metal layer. For example, stacks containing 3 metal layers or 4 metal layers (Fabry-Perot stacks) can provide desirable characteristics for some applications. In a specific embodiment, a film can have a stack containing 2 to 4 electrically-conducting metallic layers in which each of the electrically-conducting layers has a crosslinked polymeric spacing layer positioned between the metal layers. The optional crosslinked polymeric spacing layer can be formed from a variety of organic materials. The spacing layer can be crosslinked in situ after it is applied. In one embodiment, the crosslinked polymeric layer can be formed by flash evaporation, vapor deposition and crosslinking of a monomer as described above. Exemplary monomers for use in such a process include volatilizable (meth)acrylate monomers. In a specific embodiment, volatilizable acrylate monomers are employed. Suitable (meth)acrylates will have a molecular weight that is sufficiently low to allow flash evaporation and sufficiently high to permit condensation on the support. If desired, the spacing layer can also be applied using conventional coating methods such as roll coating (e.g., gravure roll coating) or spray coating (e.g., electrostatic spray coating), then crosslinked using, for example, UV radiation. The desired chemical composition and thickness of the spacing layer will depend in part on the nature of the support and the desired purpose of the film. Coating efficiency can be improved by cooling the support.

Exemplary monomers suitable for forming a spacing layer or a base coat layer include multifunctional (meth)acrylates, used alone or in combination with other multifunctional or monofunctional (meth)acrylates, such as hexanediol diacrylate, ethoxyethyl acrylate, phenoxyethyl acrylate, cyanoethyl (mono)acrylate, isobornyl acrylate, isobornyl methacrylate, octadecyl acrylate, isodecyl acrylate, lauryl acrylate, β-carboxyethyl acrylate, tetrahydrofurfuryl acrylate, dinitrile acrylate, pentafluorophenyl acrylate, nitrophenyl acrylate, 2-phenoxyethyl acrylate, 2-phenoxyethyl methacrylate, 2,2,2-trifluoromethyl (meth)acrylate, diethylene glycol diacrylate, triethylene glycol diacrylate, triethylene glycol dimethacrylate, tripropylene glycol diacrylate, tetraethylene glycol diacrylate, neopentyl glycol diacrylate, propoxylated neopentyl glycol diacrylate, polyethylene glycol diacrylate, tetraethylene glycol diacrylate, bisphenol A epoxy diacrylate, 1,6-hexanediol dimethacrylate, trimethylol propane triacrylate, ethoxylated trimethylol propane triacrylate, propylated trimethylol propane triacrylate, tris(2-hydroxyethyl)-isocyanurate triacrylate, pentaerythritol triacrylate, phenylthioethyl acrylate, naphthloxyethyl acrylate, IRR-214 cyclic diacrylate from UCB Chemicals, epoxy acrylate RDX80095 from Rad-Cure Corporation, and mixtures thereof. A variety of other curable materials can be included in the crosslinked polymeric layer, e.g., vinyl ethers, vinyl naphthylene, acrylonitrile, and mixtures thereof. The physical thickness of the crosslinked polymeric spacing layer will depend in part upon its refractive index and in part upon the desired optical characteristics of the film stack. For example, for use as an organic spacing layer in an infrared-rejecting Fabry-Perot interference stack, the crosslinked polymeric spacing layer typically will have a refractive index of about 1.3 to about 1.7, and an optical thickness of about 75 to about 200 nm, or about 100 to about 150 nm and a corresponding physical thickness of about 50 to about 130 nm, or about 65 to about 100 nm.

The smoothness and continuity of the additional metal layers and their adhesion to an underlying layer (e.g., to a crosslinked polymeric spacing layer) can be enhanced by appropriate pretreatment of the underlying layer prior to application of the second metal layer, or by inclusion of a suitable additive in the underlying layer. Exemplary pretreatments include the support pretreatments described above, such as plasma pretreatment of the spacing layer.

The uppermost layer of the film is a suitable barrier layer. The barrier layer can be disposed directly upon the conductive or metal alloy layer. The barrier layer can include a metal oxide such as zinc oxide or tin oxide. The barrier layer can also be a crosslinked polymer that has low vapor transmission as is described above. Surprisingly, a barrier layer made up of a thin layer of metal oxide that can be similar and chemistry and application to the seed layer can act as a barrier layer to provide corrosion protection when applied to the side of the conductive metal or metal alloy layer opposite that of the seed layer. In some embodiments, the barrier layer includes a layer of metal oxide disposed upon the metal or metal alloy layer and a layer of crosslinked polymer, typically an acrylate polymer, disposed directly upon the metal alloy layer. If desired, the barrier layer can be applied using conventional coating methods such as roll coating (e.g., gravure roll coating) or spray coating (e.g., electrostatic spray coating), then crosslinked using, for example, UV radiation. An exemplary method to form the barrier layer includes flash evaporating, vapor depositing, and crosslinking of a monomer as described above. Exemplary monomers for use in such a barrier layer include volatilizable (meth)acrylate monomers. In one embodiment, volatilizable acrylate monomers can be used. When the film includes a barrier layer or other surface layer and is laminated between sheets of a mechanical energy-absorbing material such as PVB, the index of refraction of the barrier layer or other surface layer can be selected to minimize reflection at the interface caused by any difference in refractive indices between the PVB and the film. The barrier layer can also be post-treated to enhance adhesion of the barrier layer to a mechanical energy-absorbing material such as PVB. Exemplary post-treatments include the support pre-treatments described above. In one embodiment, plasma post-treatment of both sides of the film can be employed. Exemplary additives for the barrier layer include the crosslinked polymeric layer additives described above.

Figure 2:
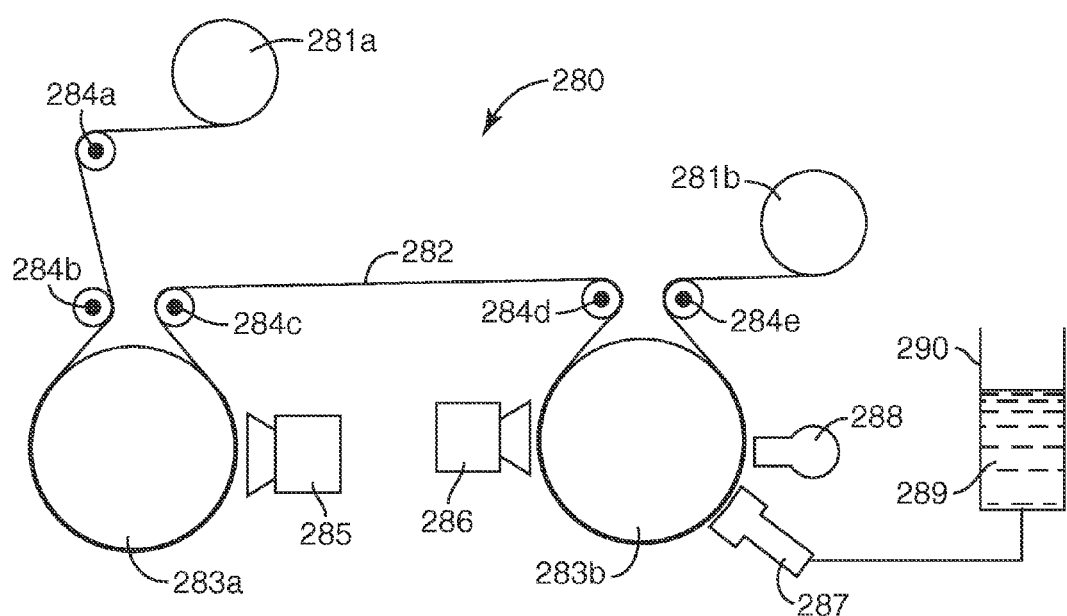
FIG. 2 is a schematic of a process line that can be utilized to practice an embodiment of the provided method and produce embodiments of the provided conductive films.

An apparatus 280 that can conveniently be used to manufacture the films of the invention is shown in FIG. 2. Powered reels 281a and 281b move supporting web 282 back and forth through apparatus 280. Temperature-controlled rotating drums 283a and 283b, and idlers 284a, 284b, 284c, 284d and 284e carry web 282 past metal sputtering applicator 285, plasma pretreater 286, monomer evaporator 287 and E-beam crosslinking apparatus 288. Liquid monomer 289 is supplied to evaporator 287 from reservoir 290. Successive layers can be applied to web 282 using multiple passes through apparatus 280. Apparatus 280 can be enclosed in a suitable chamber (not shown in FIG. 2) and maintained under vacuum or supplied with a suitable inert atmosphere in order to discourage oxygen, water vapor, dust and other atmospheric contaminants from interfering with the various pretreatment, monomer coating, crosslinking and sputtering steps. Further details regarding formation of the metal layer and crosslinked polymeric layer for the disclosed films can be found in U.S. Pat. No. 6,929,864 (Fleming et al.).

Various functional layers can be added to the disclosed films to alter or improve their physical or chemical properties, particularly at one of the surfaces of the film. Such layers or coatings can include, for example, low friction coatings or slip particles to make the film easier to handle during the manufacturing process; particles to add diffusion properties to the film or to prevent wet-out or Newton's rings when the film is placed next to another film or surface; adhesives such as pressure sensitive adhesives or hot melt adhesives; primers to promote adhesion to adjacent layers; and low adhesion backsize materials for use when the film is to be used in adhesive roll form. The functional layers or coatings can also include shatter resistant, anti-intrusion, or puncture-tear resistant films and coatings, for example, the functional layers described in U.S. Pat. No. 7,238,401 (Dietz). Additional functional layers or coatings can include vibration-damping film layers such as those described in U.S. Pat. No. 6,132,882 (Landin et al.) and U.S. Pat. No. 5,773,102 (Rehfeld), and barrier layers to provide protection or to alter the transmissive properties of the films towards liquids such as water or organic solvents or towards gases such as oxygen, water vapor or carbon dioxide. These functional components can be incorporated into one or more of the outermost layers of the film, or they can be applied as a separate film or coating.

For some applications, it may be desirable to alter the appearance or performance of the conductive film, such as by laminating a dyed film layer to the conductive film, applying a pigmented coating to the surface of the conductive film, or including a dye or pigment in one or more of the materials used to make the conductive film. The dye or pigment can absorb in one or more selected regions of the spectrum, including portions of the infrared, ultraviolet or visible spectrum. The dye or pigment can be used to complement the properties of the conductive film, particularly where the conductive film transmits some frequencies while reflecting others. A particularly useful pigmented layer that can be employed in the disclosed films is described in published U.S. Pat. No. 6,811,867 (McGurran et al.). This layer can be laminated, extrusion coated or coextruded as a skin layer on the films. The pigment loading level can be varied between about 0.01% and about 1.0% by weight to vary the visible light transmission as desired. The addition of a UV absorptive cover layer can also be desirable in order to protect any inner layers of the film that may be unstable when exposed to UV radiation.

Additional functional layers or coatings that can be added to the conductive film include, for example, antistatic coatings or films; flame retardants; UV stabilizers; abrasion resistant or hardcoat materials; optical coatings; anti-fogging materials; magnetic or magneto-optic coatings or films; liquid crystal panels; electrochromic or electroluminescent panels; photographic emulsions; prismatic films; and holographic films or images. Additional functional layers or coatings are described, for example, in U.S. Pat. No. 6,368,699 (Hebrink et al.), U.S. Pat. Nos. 6,352,761 and 6,830,713 (all Hebrink et al.).

The conductive film can be treated with, for example, inks or other printed indicia such as those used to display product identification, orientation information, advertisements, warnings, decoration, or other information. Various techniques can be used to print on the conductive film, such as, for example, screen printing, inkjet printing, thermal transfer printing, letterpress printing, offset printing, flexographic printing, stipple printing, laser printing, and so forth, and various types of ink can be used, including one and two component inks, oxidatively drying and UV-drying inks, dissolved inks, dispersed inks, and 100% ink systems.

The provided films can be joined or laminated to a wide variety of substrates. Typical substrate materials include glazing materials such as glass (which may be insulated, tempered, laminated, annealed, or heat strengthened) and plastics (such as polycarbonates and polymethylmethacrylate). The films are especially useful in connection with non-planar substrates, especially those having a compound curvature. The films are capable of conforming to such non-planar substrates during a lamination and de-airing process without substantial cracking or creasing.

The provided films can be oriented and optionally heat set under conditions sufficient to assist the film in conforming without substantial wrinkling to a non-planar substrate. This can be especially useful when a non-planar substrate to which a film is to be laminated has a known shape or curvature, and especially when the substrate has a known severe compound curvature. By individually controlling the shrinkage of the film in each in-plane direction, the film can be caused to shrink in a controlled fashion during lamination, especially during nip roll lamination. For example, if the non-planar substrate to which the film is to be laminated has a compound curvature, then the shrinkage of the film can be tailored in each in-plane direction to match the specific curvature characteristics of the substrate in those directions. The in-plane film direction having the greatest shrinkage can be aligned with the dimension of the substrate having the least curvature, that is, the greatest radius of curvature. In addition to or in place of characterizing curvature according to the radius of curvature, other measurements (such as the depth of a raised or depressed area measured from the geometric surface defined by a major surface of the substrate) can also be used if desired. For lamination to typical non-planar substrates, the film shrinkage can be greater than about 0.4% in both in-plane directions, greater than about 0.7% in at least one in-plane direction, or greater than about 1% in at least one in-plane direction. In one embodiment, the overall film shrinkage is limited to reduce edge delamination or "pull-in." Thus the film shrinkage can be less than about 3% in each in-plane direction, or less than about 2.5% in each in-plane direction. Shrinkage behavior will primarily be governed by factors such as the film or support materials employed, and the film or support stretch ratio(s), heatset temperature, residence time and toe-in (the decrease in rail spacing in a tenter heatset zone measured relative to a maximum rail setting). Coatings can also change the shrinkage properties of a film. For example, a primer coating may reduce the transverse direction ("TD") shrinkage by about 0.2% to about 0.4% and increase the machine direction ("MD") shrinkage by about 0.1 to about 0.3%. Orienting and heat setting equipment can vary widely, and ideal process settings typically are determined experimentally in each case. Further details regarding techniques for manufacturing articles with supports having targeted shrinkage properties are described in U.S. Pat. No. 6,797,396 (Liu et al.).

The provided optically clear, thin conductive films can be incorporated into optical filters which can, in turn, be utilized, for example, as IR reflecting films, glazing for windows, or in display panels for large format or hand-held electronic devices such as mobile phones, laptop computers, or compact entertainment devices. An exemplary use of the provided thin conductive films and methods of making thereof is disclosed in co-owned patent application 61/230,845 filed herewith.

Objects and advantages of this invention are further illustrated by the following examples, but the particular materials and amounts thereof recited in these examples, as well as other conditions and details, should not be construed to unduly limit this invention.

EXAMPLES

TABLE 1

Materials for Examples

| Identification | Description |
| --- | --- |
| BPDA-1 | 2,2'-diethoxy-biphenyl diacrylate, disclosed in Preparatory Examples 1 and 2 on page 26-27 of PCT Pat. Publ. No. WO 2008/112451 (Invie et al.) |
| CN147 | An acidic acrylate oligomer available under the trade designation "CN147" from Sartomer Company, Inc., Exton, Pennsylvania. |
| PTEA | Phenylthioethyl acrylate available under the trade designation "PTEA" from Bimax Chemicals Ltd., Cockeysville, Maryland. |
| IRGACURE 2022 | A photoinitiator available under the trade designation "CIBA IRGACURE 1022" from Ciba Holding Inc., Tarrytown, New York. |
| DAROCUR 1173 | A photoinitiator available under the trade designation "DAROCUR 1173" from Ciba Holding Inc., Tarrytown, New York. |
| DAROCUR TPO | A photoinitiator available under the trade designation "DAROCUR TPO" from Ciba Holding Inc., Tarrytown, NewYork. |
| Formulation 1 | An acrylate monomer solution having 83.5 parts (by wt.) BPDA-1, 6 parts CN147, 8 parts PTEA and 2.5 parts IRGACURE 2022 |
| Formulation 2 | An acrylate monomer solution having 83.5 parts (by wt.) BPDA-1, 6 parts CN147, 8 parts PTEA, 2.0 parts DAROCUR 1173 and 0.5 parts DAROCUR TPO. |

A multi-zone vacuum chamber comprising a roll to roll web handling system which allows for sequential coating and/or treatment processes; including plasma treatment, e-beam treatment, sputter coating and vapor coating; was used to prepare all examples and comparative examples. Generally, sequential coating was used to deposit up to three different materials during a single pass through the chamber. Unless otherwise noted, the web was run in the forward direction. A schematic of the coating system is shown in FIG. 2 and is essentially the same as that disclosed, for example, in FIG. 6A of U.S. Pat. No. 7,351,479 (Fleming et al.).

Test Method 1A: Optical Analysis

Measurements were made on a BYK Gardner TCS PLUS Spectrophotometer Model 8870 (BYK Gardner Inc., USA) in accordance with ASTM D1003, E308, CIE 15.2. The percent transmittance was measured from 380 to 720 nm using d/8° geometry. Reflectance was measured similarly with specular reflection included.

Test Method 1B: Optical Analysis

A Cary 100 UV-Vis spectrophotometer from Varian, Inc., Palo Alto, Calif., was used to measure optical transmission.

Test Method 1C: In-Line Optical Analysis

An in-line spectophotometer using fiber optic inputs, available under the trade designation "OPTIVISION" model number 20000427-02 available from MKS Instruments, Andover, Mass., was used to measure optical transmission on the film samples while deposition was occurring.

Test Method 2A: Electrical Analysis

The surface resistivity was measured by Eddy current method using Model 717B Benchtop Conductance Monitor, available from Delcom Instruments Inc., Prescott, Wis.

Test Method 2B: In-Line Electrical Analysis

The surface resistivity was measured in-line by Eddy current method using a Model 727R Dual Head Conductance Monitor available from Delcom Instruments Inc., Prescott, Wis.

Test Method 3: Shielding Effectiveness

Shielding effectiveness for a frequency range of 100 MHz to 1.5 GHz was characterized in accordance with ASTM D-4935.

Test Method 4A: Reliability Analysis

Film samples, approximately 5.1 cm×5.1 cm, were placed in controlled temperature and humidity chambers. A set of samples was placed in a chamber set at 65° C. and 90% relative humidity (RH) for 3 days. Another set of samples was placed in a chamber set at 85° C. and 85% RH for 3 days. Samples were visually inspected for defects.

Test Method 4B: Reliability Analysis

Film samples, approximately 5.1 cm×5.1 cm, were placed in controlled temperature and humidity chambers. A set of samples was placed in a chamber set at 65° C. and 90% RH for 14 days. Another set of samples was placed in a chamber set at 85° C. and 85% RH for 5 days. Samples were visually inspected for defects.

Comparative Example 1A

Ag/Au Conductive Layer with $SnO_2$ Seed Layer

A polyester (PET) web with a thickness of 5 mil (0.13 mm) and a width of 508 mm available under the trade designation "ST505" from Dupont Teijin Films Ltd., Hopewell, Va., was loaded into a roll to roll vacuum chamber. The polyester web was sequentially sputter coated with a first $SnO_2$ layer and then coated with an acrylate solution (Formulation I), which was e-beam cured producing a first acrylate layer, during one pass through the vacuum chamber at a web speed of about 50 fpm (15 m/min). Sputter coating proceeded as follows. The vacuum chamber pressure was reduced to less than $5\times10^{-5}$ torr. Argon gas at a flow rate of 60 standard cubic centimeters per minute (sccm) and oxygen at a flow rate of 8 sccm was introduced into the vacuum chamber through the $SnO_2$ source, producing a pressure of $4.9\times10^{-4}$ torr. The $SnO_2$ source, which was slightly reduced (non-stoichiometric), was sputtered coated at 2,000 watts power (342.6 volts and 6.0 amps). Formation of the first acrylate layer proceeded as follows. Prior to coating the acrylate solution onto the polyester web, about 120 ml of the acrylate solution (Formulation 1) was degassed in a vacuum bell jar until reaching a pressure of 60 mTorr. The acrylate solution was loaded into a pressure cylinder with a 38 mm diameter and a 120-125 mL capacity. A lead-screw driven monomer pump was used to pump the solution from the cylinder through an ultrasonic atomizer at a rate of about 1.05 mL/min. After atomization, the acrylate solution was flash evaporated at a temperature of about 275° C., followed by condensing of the solution vapor onto the PET web. Condensation was facilitated by contacting the uncoated PET web surface to the circumference of a drum maintained at a temperature of ≤−17° C. The condensed solution was e-beam cured at a voltage of 8.5 KV and a current of 51 mA.

The polyester web was rewound and a second layer of $SnO_2$ and a first Ag/Au metal alloy layer were sequentially deposited onto the surface of the web adjacent to the first acrylate layer at a line speed of 50 fpm (15 m/min). $SnO_2$ was sputter coated using essentially the same materials and process conditions as the first $SnO_2$ layer. Deposition of the Ag/Au metal alloy layer was conducted by introducing argon at a flow rate of 120 sccm into the vacuum chamber and DC magnetron through an 85/15 (wt./wt.) Ag/Au source. In order to form different thicknesses of the metal alloy layer, four different power levels were run, 2,000 watts, 2,300 watts, 2,500 watts and 4,000 watts. Run times at each power level were on the order of 1 minute to produce 50 feet (15 m) of each sample.

The web was run in the reverse direction and a third layer of $SnO_2$ was deposited onto the surface of the web adjacent to the first metal alloy layer. $SnO_2$ was sputter coated using essentially the same materials and process conditions as the first $SnO_2$ layer. A second acrylate layer was deposited on the web surface adjacent to the third $SnO_2$ layer producing Comparative Example 1A. The materials and process conditions used to deposit the second acrylate layer were essentially the same as those used to produce the first acrylate layer, accept the monomer pump flow rate was 0.55 mL/min and the line speed was 65 fpm (19.8 m/min).

Comparative Example 1B

Film with Ag/Au Alloy Layer and ZnO Seed Layer

The polyester web described in Comparative Example 1A was used. The polyester web was sequentially sputter coated with a first $SnO_2$ layer and coated with an acrylate solution, which was e-beam cured producing a first acrylate layer, using essentially the same materials and process conditions as described to produce the first $SnO_2$ layer and first acrylate layer of Comparative Example 1A.

The polyester web was rewound and a first $ZnO/Al_2O_3$ (98 wt % ZnO) layer and a first Ag/Au metal alloy layer were sequentially deposited on the surface of the web adjacent to the first acrylate layer. Sputter coating of the first $ZnO/Al_2O_3$ layer was conducted as follows. The vacuum chamber pressure was reduced to less than $5\times10^{-5}$ torr. Argon gas at a flow rate of 36 sccm and was introduced into the vacuum chamber through a gas delivery tube of the $ZnO/Al_2O_3$ 98/2 (wt %/wt %) magnetron source, producing a pressure of $4.9\times10^{-3}$ torr. The $ZnO/Al_2O_3$ source, which was slightly reduced (non-stoichiometric), was sputter coated at 2,000 watts power (342.6 volts and 6.0 amps) at a line speed of 50 fpm (15 m/min). Sputter coating of the first Ag/Au metal alloy layer was conducted using essentially the same materials and procedures as described to coat the first Ag/Au layer of Comparative Example 1A.

The polyester web was run in the reverse direction and a second $ZnO/Al_2O_3$ layer was deposited onto the surface of the web adjacent to the first Ag/Au metal alloy layer. The second $ZnO/Al_2O_3$ layer was sputter coated using essentially the same materials and process conditions as those used to produce the first $ZnO/Al_2O_3$ layer.

A second acrylate layer was deposited on the web surface adjacent to the second $ZnO/Al_2O_3$ layer producing Comparative Example 1B. The materials and process conditions used to deposit the second acrylate layer were essentially the same as those used to produce the second acrylate layer of Comparative Example 1A.

Example 1

Ag/Au Conductive Layer with $SnO_2$ Underlayer and ZnO Seed Layer

The polyester web described in Comparative Example 1A was used. The web was plasma treated as follows. The vacuum chamber pressure was reduced to $5\times10^{-5}$ torr. Nitrogen gas at a flow rate of 65 sccm was introduced into the vacuum chamber through a $SnO_2$ source producing a pressure of $3.7\times10^{-3}$ torr, the $SnO_2$ source being described in Comparative Example 1A. Plasma treatment was conducted at a power of 1,000 watts and a line speed of 50 fpm (15 m/min). A first acrylate layer was deposited on the plasma treated web using essentially the same materials and process conditions as described to produce the first acrylate layer of Comparative Example 1A. The polyester web was run in the reverse direction and sputter coated with a first $SnO_2$ layer using essentially the same materials and process conditions as described to produce the first $SnO_2$ layer of Comparative Example 1A.

A first $ZnO/Al_2O_3$ layer and a first Ag/Au metal alloy layer were sequentially deposited on the surface of the web adjacent to the first $SnO_2$ layer. The first $ZnO/Al_2O_3$ layer and the first Ag/Au metal alloy layer were deposited using essentially the same materials and process conditions as described to produce the first $ZnO/Al_2O_3$ layer and the first Ag/Au metal alloy layer of Comparative Example 1B.

The polyester web was run in the reverse direction and a second $ZnO/Al_2O_3$ layer was deposited onto the surface of the web adjacent to the first Ag/Au metal alloy layer. The second $ZnO/Al_2O_3$ layer was sputter coated using essentially the same materials and process conditions as described to produce the second $ZnO/Al_2O_3$ layer of Comparative Example 1B.

A second $SnO_2$ layer was deposited on the web surface adjacent to the second $ZnO/Al_2O_3$ layer. The second $SnO_2$ layer was sputter coated using essentially the same materials and process conditions as described to produce the first $SnO_2$ layer of Comparative Example 1A, except the line speed was increased to 65 fpm (19.8 m/min) and the sputtering power was increased from 2,600 watts to compensate for the speed increase.

A second acrylate layer was sequentially deposited on the web adjacent to the second $SnO_2$ layer, producing Example 1. The materials and process conditions used to deposit the second acrylate layer were essentially the same as those used to produce the second acrylate layer of Comparative Example 1A.

Example 2

Ag/Au Conductive Layer with $SnO_2$ Underlayer and ZnO Seed Layer

Example 2 was prepared using essentially the same materials, process order and process conditions as described in Example 1, with the following modifications. A polyester web, unprimed, with a 2 mil (0.05 mm) thickness and a width of 508 mm available under the trade designation "TEIJIN TETORON HB3" from DuPont Teijin Films Ltd., was loaded into the roll to roll vacuum chamber. The second layer of $SnO_2$ was not deposited. The second acrylate layer was subsequently deposited adjacent to the second $ZnO/Al_2O_3$ layer. Additionally, when the first Ag/Au metal alloy layer was deposited, a power level of 2,200 watts was employed.

Comparative Example 3

Ag Conductive Layer with ZnO Underlayer and ZnO Seed Layer

A polyester web, having a thickness of 3 mil (0.08 mm) and a width of 508 mm available under the trade designation "SKC SKYROL AH81L" from SKC Inc., Covington, Ga., was loaded into the roll to roll vacuum chamber. The web was plasma treated as described in Example 1. The web was run in the reverse direction and a first $ZnO/Al_2O_3$ layer was deposited on the plasma layer as follows. The vacuum chamber pressure was reduced to less than $5 \times 10^{-5}$ torr. Argon gas at a flow rate of 75 sccm and was introduced into the vacuum chamber through a gas delivery tube of the $ZnO/Al_2O_3$ 98/2 (wt %/wt %) magnetron source, producing a pressure of $4.9 \times 10^{-3}$ torr. The $ZnO/Al_2O_3$ source, which was slightly reduced (non-stoichiometric), was sputter coated at 2,000 watts power (342.6 volts and 6.0 amps) at a line speed of 10 fpm (3 m/min). All subsequent $ZnO/Al_2O_3$ layers for this comparative example used this source.

A first acrylate layer was deposited on the $ZnO/Al_2O_3$ layer using essentially the same materials and process conditions as described to produce the first acrylate layer of Comparative Example 1A, except the acrylate monomer solution was Formulation 2. The polyester web was run in the reverse direction and sputter coated with a second $ZnO/Al_2O_3$ layer using essentially the same process conditions as described to produce the first $ZnO/Al_2O_3$ layer of Comparative Example 1B, except the argon gas flow rate was 75 sccm. The web was run in the forward direction and a third $ZnO/Al_2O_3$ layer, a first Ag metal layer and a fourth $ZnO/Al_2O_3$ layer were sequentially deposited on the surface of the web adjacent to the second $ZnO/Al_2O_3$ layer at a web speed of 50 fpm (15 m/min). The third $ZnO/Al_2O_3$ layer was deposited with argon at a flow rate of 60 sccm, oxygen at a flow rate of 10 sccm and a power of 2,000 watts. The silver layer was sputtered from a silver target using an argon flow of 120 sccm at a power level of 4,000 watts. The fourth $ZnO/Al_2O_3$ layer was deposited using essentially the same process conditions as described to produce the second $ZnO/Al_2O_3$ layer.

The polyester web was run in the reverse direction and a fifth $ZnO/Al_2O_3$ layer was deposited onto the surface of the web adjacent to the fourth $ZnO/Al_2O_3$ layer. The fifth $ZnO/Al_2O_3$ layer was sputter coated using an argon flow rate of 75 sccm, 2000 watts power and a web speed of 5 fpm (1.5 m/min).

The web was run in the forward direction and a second acrylate layer (barrier) was deposited on the web adjacent to the fifth $ZnO/Al_2O_3$ layer, producing Comparative Example 3. The materials and process conditions used to deposit the second acrylate layer were essentially the same as those used to produce the second acrylate layer of Comparative Example 1A, except Formulation 2 was used.

Example 3

Ag Conductive Layer with $SnO_2$ Underlayer and ZnO Seed Layer

The polyester web described in Comparative Example 3 was used. The $SnO_2$ source and $ZnO/Al_2O_3$ source used for the deposition of all SnO2 and $ZnO/Al_2O_3$ layers were the same as described in Comparative Example 1A and Comparative Example 1B, respectively. The web was sequentially plasma treated, sputter coated with a first $SnO_2$ layer and sputter coated with first $ZnO/Al_2O_3$ layer at a web speed of 40 fpm. Plasma treatment was as follows. The vacuum chamber pressure was reduced to $3 \times 10^{-5}$ torr. Nitrogen gas at a flow rate of 65 sccm was introduced into the vacuum chamber through a $SnO_2$ source producing a pressure of $3.7 \times 10^{-3}$ torr. Plasma treatment was conducted at a power of 800 watts. The first $SnO_2$ layer was deposited using an argon flow rate of 50 sccm, oxygen at a flow rate of 10 sccm and 2,000 watts power. The first $ZnO/Al_2O_3$ layer was deposited using an argon flow rate of 75 sccm and 2000 watts power. The web was run in the reverse direction and a second $ZnO/Al_2O_3$ layer and a second $SnO_2$ layer was deposited sequentially adjacent to the first $ZnO/Al_2O_3$ layer. The second $ZnO/Al_2O_3$ layer was deposited using the same process conditions described for the first $ZnO/Al_2O_3$ layer except the line speed was 100 fpm (30 m/min). The second $SnO_2$ layer was deposited using the same process conditions described for the first $SnO_2$ layer except the line speed was 100 fpm (30 m/min).

With the web running in the forward direction, a first acrylate layer was deposited on the web surface adjacent to the second $SnO_2$ layer at a web speed of 100 fpm (30 m/min). The first acrylate layer was deposited using a similar process as that described for the first acrylate layer of Comparative Example 1A, except Formulation 2 was used and the monomer pump was adjusted to 2.1 mL/min. While running the web in the reverse direction, a third $ZnO/Al_2O_3$ layer and a third $SnO_2$ layer were sequentially deposited on the web surface adjacent to the first acrylate layer at a web speed of 100 fpm (30 m/min). The third $ZnO/Al_2O_3$ layer was deposited using an argon flow rate of 75 sccm and 2,000 watts power. The third $SnO_2$ layer was deposited using an argon flow rate of 50 sccm, oxygen at a flow rate of 10 sccm and 2,000 watts power.

With the web running in the forward direction, a fourth ZnO/Al$_2$O$_3$ layer, a first Ag metal layer and a fifth ZnO/Al$_2$O$_3$ layer were sequentially deposited on the web surface adjacent to the third SnO$_2$ layer at a web speed of 50 fpm (15 m/min). The fourth ZnO/Al$_2$O$_3$ layer was deposited using an argon flow rate of 60 sccm, oxygen at a flow rate of 10 sccm and 2,000 watts power. The first Ag layer was sputtered from a silver target using an argon flow rate of 120 sccm and a power of 4,000 watts. The fifth ZnO/Al$_2$O$_3$ layer was deposited using an argon flow rate of 75 sccm and 2,000 watts power.

With the web running in the reverse direction, a sixth ZnO/Al$_2$O$_3$ layer and a fourth SnO$_2$ layer were sequentially deposited on the web surface adjacent to the fifth ZnO/Al$_2$O$_3$ layer at a web speed of 10 fpm (3 m/min). The sixth ZnO/Al$_2$O$_3$ layer was deposited using an argon flow rate of 75 sccm and 2,000 watts power. The fourth SnO$_2$ layer was deposited using an argon flow rate of 50 sccm, oxygen at a flow rate of 10 sccm and 2,000 watts power. With the web running in the forward direction, a second acrylate layer was deposited on the web surface adjacent to the fourth SnO$_2$ layer producing Example 3. The second acrylate layer was deposited using a similar process as that described for the first acrylate layer of Comparative Example 1A, except Formulation 2 was used, the monomer pump was adjusted to 1.1 mL/min and the web speed was 130 fpm (39 m/min).

Figure 3:
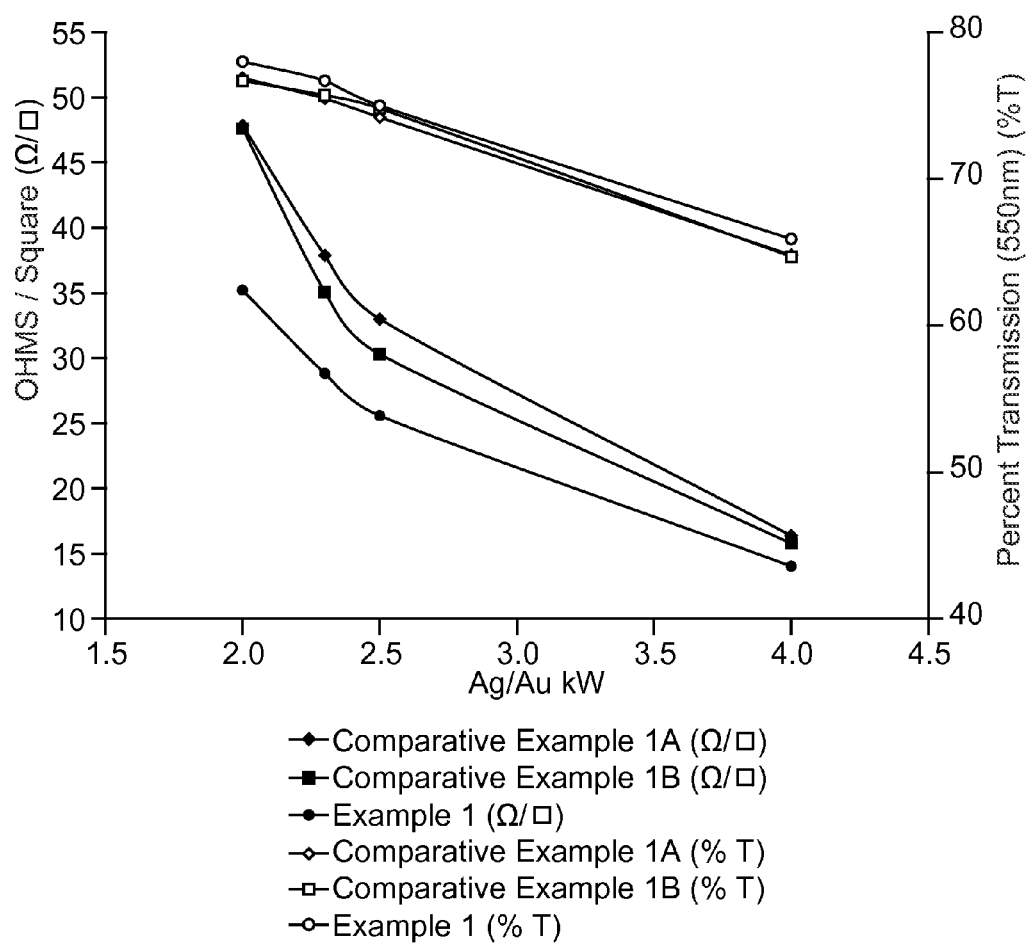
FIG. 3 is a graph of the electrical resistance and the optical transmission (at 550 nm) of films of two comparative examples and a provided conductive film.

FIG. 3 is a graphic representation of the data displayed in Table 2. The graph displays electrical surface resistivity and visible transmission at 550 nm for samples of Comparative Examples 1A, 1B, and Example 1 at various Ag/Au alloy thicknesses (various power levels of sputtering). Comparative Example 1A displays properties of a conductive film that was vacuum deposited (sputtered) on a single SnO$_2$ nucleation layer. Comparative Example 1B displays properties of a conductive film that was vacuum deposited (sputtered) on a single ZnO polycrystalline seed layer. Example 1 displays properties of a conductive film that was vacuum deposited (sputtered) on a polycrystalline seed layer of ZnO deposited directly upon a nucleation layer of SnO$_2$. The graph shows that, surprisingly, the conductive films deposited on the combination of a ZnO polycrystalline seed layer and a SnO$_2$ nucleation layer have less sheet resistance and comparable or better optical transmission that films of comparable thickness deposited on each layer separately.

Figure 4A:
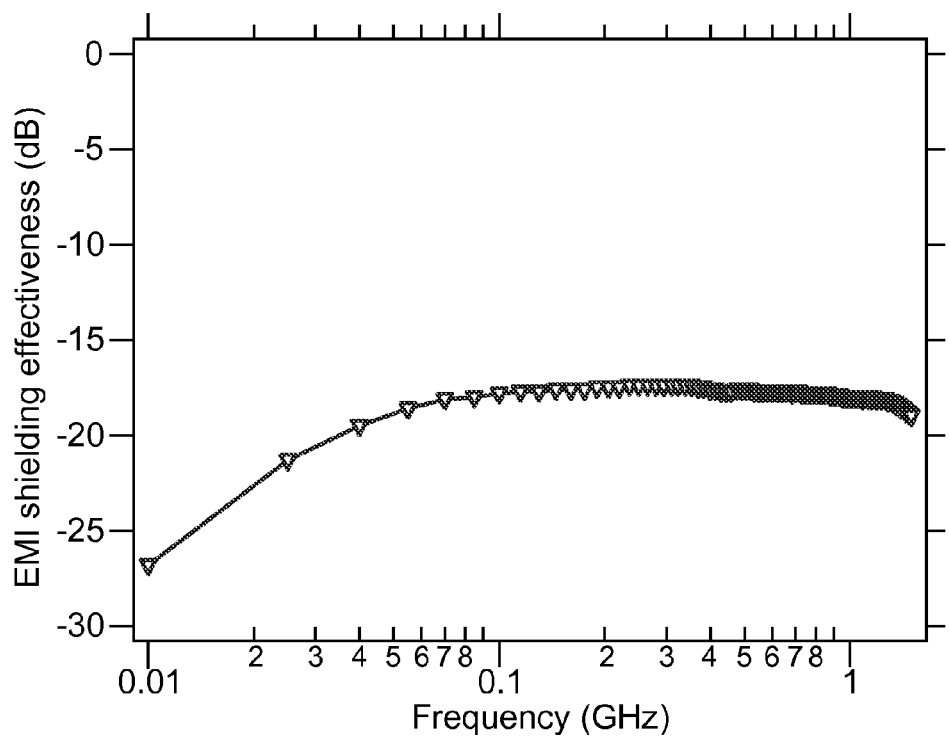
FIGS. 4A and 4B graphically illustrate electrical (EMI shielding effectiveness) and optical (transmission) properties of an embodiment of the provided conductive films.
Figure 4B:
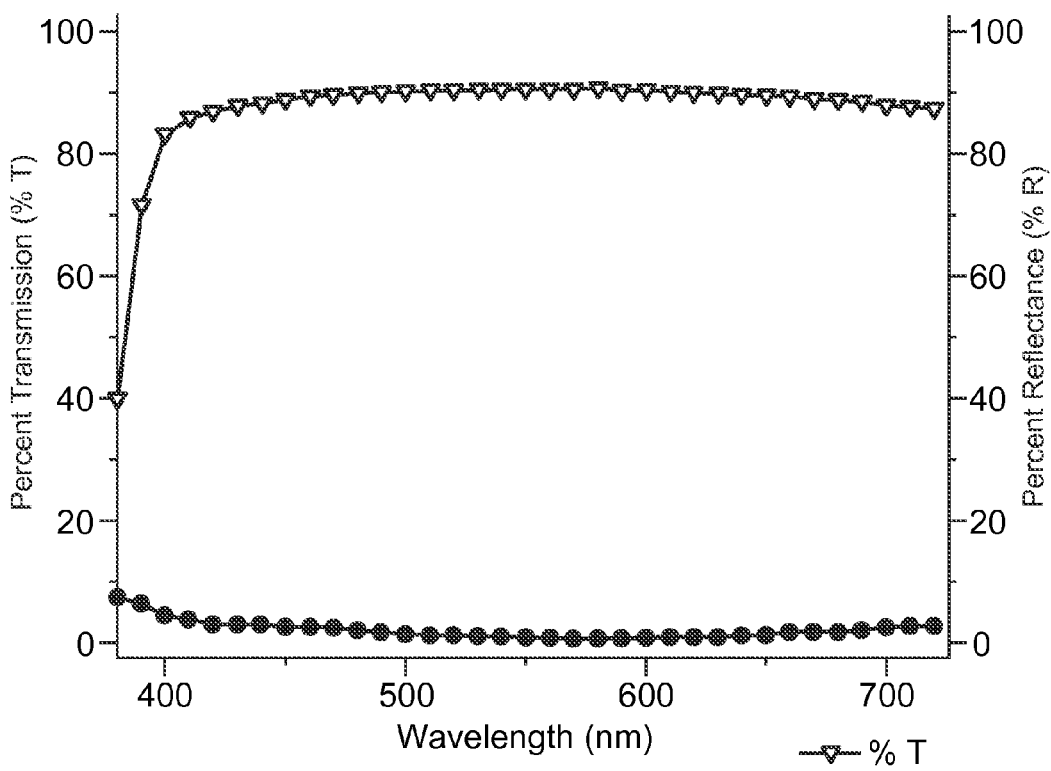
Figure 5:
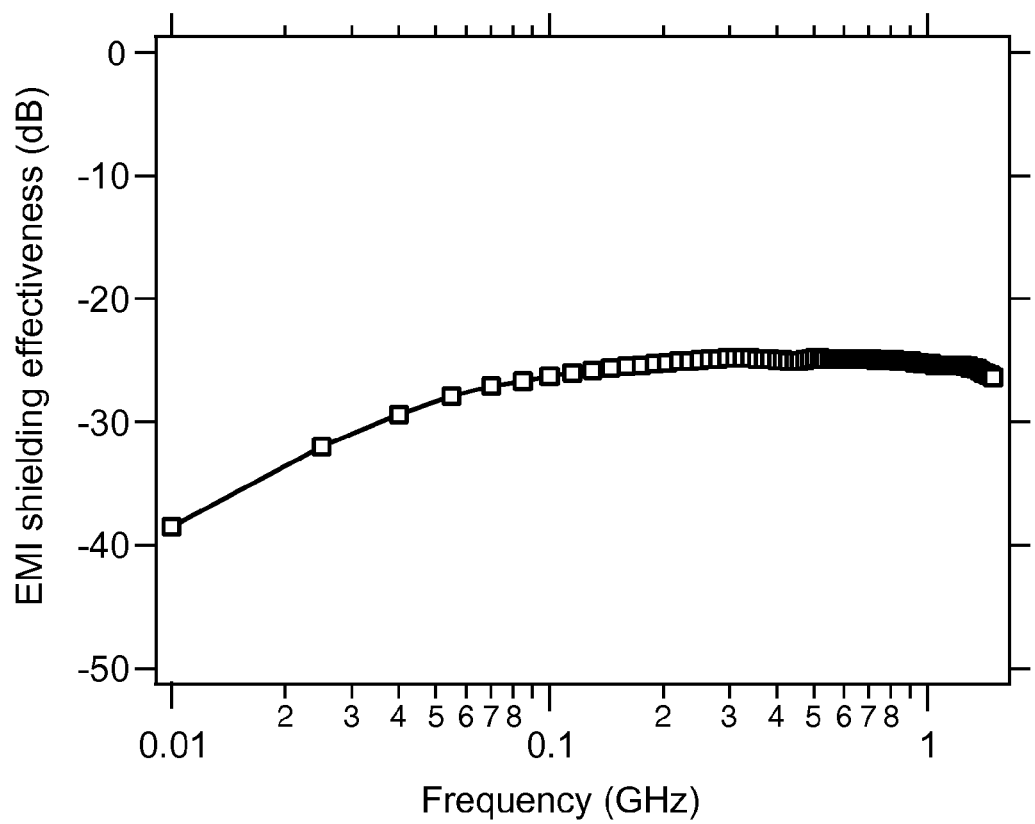
FIG. 5 is a graph of the EMI shielding effectiveness of another embodiment.

FIGS. 4A and 4B display electrical and optical properties of Example 2. FIG. 4A is a graph of the EMI shielding effectiveness of a sample from Example 2. FIG. 4B shows the transmittance and reflectance of that same film from about 400 nm to about 700 nm. Example 2 has high transmittance over a large range of wavelengths and very low reflectance. FIG. 5 displays the EMI shielding curve for Example 3 (Ag only).

TABLE 2

Optical and Surface Resistivity Test Results*

| Sample | Power during Ag/Au deposition (Watts) | Transmission @ 550 nm (%) (Test Method 1C) | Surface Resistivity (Ohms per square) (Test Method 2B) |
|---|---|---|---|
| Comparative Example 1A | 2,000 | 76.9 | 47.9 |
| Comparative Example 1A | 2,300 | 75.5 | 37.9 |
| Comparative Example 1A | 2,500 | 74.2 | 33.0 |
| Comparative Example 1A | 4,000 | 64.8 | 16.4 |
| Comparative Example 1B | 2,000 | 76.7 | 47.6 |
| Comparative Example 1B | 2,300 | 75.7 | 35.1 |
| Comparative Example 1B | 2,500 | 74.8 | 30.3 |
| Comparative Example 1B | 4,000 | 64.7 | 15.8 |
| Example 1 | 2,000 | 78.0 | 35.2 |
| Example 1 | 2,300 | 76.7 | 28.8 |
| Example 1 | 2,500 | 75.0 | 25.6 |
| Example 1 | 4,000 | 65.9 | 14.0 |

*The transmission data and surface resistance test results in Table 2 were taken for each example and comparative example while the web was being processed, i.e. in-line measurements, immediately after the metal alloy layer was deposited.

TABLE 3

Reliability Analysis Test Results

| Sample | Test Method | Power during metal deposition (Watts) | Chamber Conditions 65° C./90% RH | Chamber Conditions 85° C./85% RH |
|---|---|---|---|---|
| Comparative Example 1A | 4A | 2,000 | visible defects | visible defects |
| Comparative Example 1B | 4A | 2,000 | no visible defects | visible defects |
| Example 1 | 4A | 2,000 | no visible defects | no visible defects |
| Example 2 | 4A | 2,200 | no visible defects | no visible defects |
| Comparative Example 3 | 4B | 4,000 | visible defects | visible defects |
| Example 3 | 4B | 4,000 | no visible defects | no visible defects |

TABLE 4

Optical Analysis Test Results

| Sample | Test Method | Power during metal deposition (Watts) | Transmission Data (%) | Transmission Data (%) after Test Method 4B: 65° C./90% RH | Transmission Data (%) after Test Method 4B: 85° C./85% RH |
|---|---|---|---|---|---|
| Comparative Example 1A | 1A | 2,000 | 87.0 | — | — |
| Comparative Example 1B | 1A | 2,000 | 86.2 | — | — |
| Example 1 | 1A | 2,000 | 87.7 | — | — |
| Example 2 | 1B | 2,200 | 88.8 | — | — |
| Comparative Example 3 | 1B | 4,000 | 86.6 | 83.7 | 86.1 |
| Example 3 | 1B | 4,000 | 86.4 | 86.2 | 86.1 |

TABLE 5

Electrical Analysis Test Results

| Sample | Test Method | Power during metal deposition (Watts) | Surface Resistivity (ohms per square) | Surface Resistivity (ohms per square) after Test Method 4B: 65° C./ 90% RH | Surface Resistivity (ohms per square) after Test Method 4B: 85° C./ 85% RH | Surface Resistivity (ohms per square) after Test Method 4A: 65° C./ 90% RH | Surface Resistivity (ohms per square) after Test Method 4A: 85° C./ 85% RH |
|---|---|---|---|---|---|---|---|
| Comparative Example 1A | 2A | 2,000 | 39.8 | — | — | — | — |
| Comparative Example 1A | 2a | 2,000 | 36.2 | — | — | — | — |
| Example 1 | 2A | 2,000 | 30.6 | — | — | — | — |
| Example 2 | 2A | 2,200 | 32.2 | — | — | 32.8 | 36.6 |
| Comparative Example 3 | 2A | 4,000 | 11.6 | 12.5 | 11.6 | — | — |
| Example 3 | 2A | 4,000 | 11.0 | 10.8 | 11.0 | — | — |

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows. All references cited in this disclosure are herein incorporated by reference in their entirety.

What is claimed is:

1. An optically clear conductive film comprising:
   a transparent support;
   a layer of metal oxide comprising tin oxide upon the support;
   a polycrystalline seed layer comprising zinc oxide disposed directly upon the metal oxide layer;
   a first conductive metal or metal alloy layer disposed directly upon the polycrystalline seed layer; and
   a barrier layer atop the metal or metal alloy layer.

2. A conductive film according to claim 1, further comprising a polymeric base coat layer between the transparent support and the metal oxide layer.

3. A conductive film according to claim 2, wherein the polymeric base coat layer comprises an acrylate polymer.

4. A conductive film according to claim 1, wherein the conductive metal or metal alloy layer comprises silver.

5. A conductive film according to claim 1, further comprising a bi-layer including:
   a crosslinked polymeric spacing layer directly upon the first conductive metal or metal alloy layer; and
   a second conductive metal or metal alloy layer directly upon the crosslinked polymeric spacing layer, wherein the barrier layer is atop the second conductive metal or metal alloy layer.

6. A conductive film according to claim 5, comprising 2 to 4 bi-layers, to provide an infrared-rejecting Fabry-Perot stack.

7. An electronic device comprising the film of claim 1.

8. A method for forming an optically clear thin conductive film on a support comprising:
   providing a layer of metal oxide comprising tin oxide adjacent to a transparent support;
   forming a polycrystalline seed layer comprising zinc oxide directly upon the metal oxide layer;
   depositing a first conductive metal or metal alloy layer directly upon the polycrystalline seed layer; and
   depositing a barrier layer atop the metal or metal alloy layer.

9. A method according to claim 8, further comprising vapor coating a first polymeric material upon the support.

10. A method according to claim 8, wherein the polycrystalline seed layer further comprises aluminum oxide.

11. A method according to claim 8, wherein the first conductive metal or metal alloy comprises silver or gold.

12. A method according to claim 8, wherein the film has at least 80% optical transmittance of visible light at 550 nm.

13. A method according to claim 8, wherein the film has a sheet resistance of less than about 100 ohms/square resistance.

14. A method according to claim 8, further comprising:
   depositing a crosslinked polymeric spacing layer directly upon the first conductive metal or metal alloy layer; and
   depositing a second conductive metal or metal alloy layer directly upon the crosslinked polymeric spacing layer;
   wherein the barrier layer is atop the second conductive metal or metal alloy layer.

15. A method according to claim 8, further comprising repeating the depositing steps of claim 14 to provide an infrared-rejecting Fabry-Perot stack, wherein the barrier layer is atop the Fabry-Perot stack.

16. A method according to claim 14, wherein the thickness of the polymeric spacing layer is from about 1 nm to about 5 nm.

17. A method for making a glazing article comprising:
   assembling a layer of glazing material and an optically clear film, wherein the film comprises:
      a transparent support;
      a layer of metal oxide comprising tin oxide upon the first polymeric material;
      a polycrystalline seed layer comprising zinc oxide disposed directly upon the metal oxide layer;
      a conductive metal or metal alloy layer disposed directly upon the polycrystalline seed layer; and
      a barrier layer disposed directly upon the conductive metal or metal alloy layer; and
   bonding the glazing material and the film together into a unitary article.

18. A method according to claim 17, wherein the glazing material comprises glass and the article comprises an adhesive layer between the film and the glass.

\* \* \* \* \*

UNITED STATES PATENT AND TRADEMARK OFFICE
CERTIFICATE OF CORRECTION

PATENT NO. : 9,012,044 B2
APPLICATION NO. : 13/388329
DATED : April 21, 2015
INVENTOR(S) : Bright It is certified that error appears in the above-identified patent and that said Letters Patent is hereby corrected as shown below:

On title page item [56]

Delete "Lauern" and insert -- Lauren --, therefor.

In the specification

Column 7
Line 11, Delete "resistance" and insert -- resistance. --, therefor.

Column 8
Line 21, Delete "naphthloxyethyl" and insert -- naphthyloxyethyl --, therefor.

Column 11
Line 27, After "61/230,845" insert -- [Attorney Docket No. 65572US002] --.
Line 55 (Table 1), Delete "NewYork." and insert -- New York. --, therefor.

Column 12
Line 17, Delete "spectophotometer" and insert -- spectrophotometer --, therefor.

Column 16
Line 27, Delete "SnO2" and insert -- $SnO_2$ --, therefor.

In the claims

Column 20
Line 41, Claim 15, delete "claim 8," and insert -- claim 14, --, therefor.

Signed and Sealed this
Twenty-third Day of February, 2016

Michelle K. Lee
*Director of the United States Patent and Trademark Office*